(12) United States Patent
Posseme et al.

(10) Patent No.: US 11,164,752 B2
(45) Date of Patent: Nov. 2, 2021

(54) METHOD OF ETCHING A DIELECTRIC LAYER

(71) Applicant: Commissariat A L'Energie Atomique et aux Energies Alternatives, Paris (FR)

(72) Inventors: Nicolas Posseme, Grenoble (FR); Frederic Le Roux, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 96 days.

(21) Appl. No.: 16/722,228

(22) Filed: Dec. 20, 2019

(65) Prior Publication Data
US 2020/0227271 A1    Jul. 16, 2020

(30) Foreign Application Priority Data
Dec. 21, 2018   (FR) ...................... 18 74062

(51) Int. Cl.
| | | |
|---|---|---|
| *H01L 21/311* | (2006.01) | |
| *H01L 21/3115* | (2006.01) | |
| *H01L 23/29* | (2006.01) | |
| *H01L 23/31* | (2006.01) | |
| *H01L 29/20* | (2006.01) | |

(52) U.S. Cl.
CPC .. *H01L 21/31116* (2013.01); *H01L 21/31144* (2013.01); *H01L 21/31155* (2013.01);
(Continued)

(58) Field of Classification Search
CPC ......... H01L 21/31155; H01L 21/31116; H01L 21/31111; H01L 21/31144; H01L 21/26506
See application file for complete search history.

(56) References Cited

U.S. PATENT DOCUMENTS

| | | | | |
|---|---|---|---|---|
| 2004/0118805 A1* | 6/2004 | Hareland | .......... | H01L 21/26506 216/13 |
| 2005/0236365 A1* | 10/2005 | Komatani | ......... | H01L 29/66462 216/67 |

(Continued)

FOREIGN PATENT DOCUMENTS

| | | |
|---|---|---|
| CN | 106504986 A | 3/2017 |
| EP | 2 750 170 A1 | 7/2014 |

OTHER PUBLICATIONS

French Preliminary Search Report dated Sep. 3, 2019 in French Application 18 74062 filed on Dec. 21, 2018 (with English Translation of Categories of Cited Documents) 3 pages.

(Continued)

*Primary Examiner* — Alia Sabur
(74) *Attorney, Agent, or Firm* — Oblon, McClelland, Maier & Neustadt, L.L.P.

(57) ABSTRACT

A method is provided for etching a dielectric layer disposed on at least one layer based on gallium nitride (GaN), the dielectric layer being formed by a material based on one from $Si_xN_y$ and $Si_xO_y$, the method including: first etching of the dielectric layer on only part of a thickness to define therein a partial opening and a residual portion situated in line with the opening and having another thickness; implanting ions in line with the opening over a thickness greater than the another thickness to modify a material of the dielectric layer over an entire thickness of the residual portion, and modify a material of the base layer of GaN; removing the residual portion by a second etching, selective of the modified dielectric layer with respect to the nonmodified material and with respect to the modified layer based on GaN; and annealing of the layer based on GaN.

20 Claims, 5 Drawing Sheets

(52) U.S. Cl.
CPC ........ *H01L 23/291* (2013.01); *H01L 23/3171* (2013.01); *H01L 29/2003* (2013.01)

(56) References Cited

U.S. PATENT DOCUMENTS

| | | |
|---|---|---|
| 2013/0161634 A1* | 6/2013 | Disney ................ H01L 29/0619 257/76 |
| 2014/0187046 A1 | 7/2014 | Posseme et al. |
| 2016/0035581 A1* | 2/2016 | Posseme ............... H01L 21/266 438/705 |
| 2016/0300709 A1 | 10/2016 | Posseme et al. |

OTHER PUBLICATIONS

Chu, R, et al., "Impact of $CF_4$ Plasma Treatment on GaN", IEEE Electron Device Letters, vol. 28, No. 9, 2007, pp. 781-783.

Kawakami, R, et al., "Comparison between AlGaN surfaces etched by carbon tetrafluoride and argon plasmas: Effect of the fluorine impurities incorporated in the surface", Vacuum 119, 2015, pp. 264-269.

Cai, Y, et al., "Control of Threshold Voltage of AlGaN/GaN HEMTs by Fluoride-Based Plasma Treatment: From Depletion Mode to Enhancement Mode", IEEE Transactions on Electron Devices, vol. 53, No. 9, 2006, pp. 2207-2215.

Linkohr, S, et al., "Influence of plasma treatments on the properties of GaN/AlGaN/GaN HEMT structures", Phys. Status Solidi C vol. 9, No. 3-4, 2012, pp. 1096-1098.

\* cited by examiner

METHOD OF ETCHING A DIELECTRIC LAYER

TECHNICAL FIELD

The present invention relates in general to the integration of layers based on gallium nitride (GaN) in microelectronic devices. It will find an advantageous application in the production of devices such as transistors or diodes integrating one or more layers comprising gallium nitride (GaN).

PRIOR ART

The search for energy savings and the increase in requirements are pushing manufacturers of microelectronic devices to improve the efficiency and performance of their electrical energy conversion systems. Currently, conversion circuits are manufactured from silicon and much research has been carried out in order to develop architectures for the purpose of gaining in efficiency and conductivity. Nevertheless, these known devices are arriving at the theoretical limits of silicon and novel solutions must be developed.

By virtue of its electrical properties allowing the formation of a two-dimensional electron gas, the AlGaN/GaN heterostructure, formed by a layer of aluminium-gallium nitride on a layer of gallium nitride, offers good prospects for the development of power electronics. It is competitive with Si and SiC in terms of size of device, voltage strength, mobility of carriers and series resistance.

Nevertheless, the practical use of this AlGaN/GaN heterostructure, for example in a transistor or a diode, poses serious problems that it is necessary to solve in order to exploit all the performances of these materials based on GaN. It has in particular been identified that the etching steps, for device structuring, are critical and degrade the electrical properties of the channel.

These etching steps relate in particular to the opening of a passivation layer lying on top of the AlGaN/GaN heterostructure in order to form the contacts of a diode or to form the gate or contacts for the transistors, for example HEMT transistors (acronym for "High Electron Mobility Transistor").

FIGS. 1A to 1C illustrate the steps of the known solutions as well as the drawbacks caused by these solutions.

FIG. 1A illustrates a stack comprising successively a layer of AlGaN 100, a passivation layer 200 made from SiN or SiO$_2$, and a resist mask 300. The resist mask 300 has an opening 400.

As illustrated in FIG. 1B, the passivation layer 200 is next opened through the resist mask 300 in order to form a hard mask. This opening 401 of the passivation layer 200 is performed by plasma etching based on fluorocarbon (FC) chemistry.

These methods lead to incorporating fluorinated ions in the AlGaN layer 100. The AlGaN layer 100 then has a zone 101 the electrical characteristics of which are modified and degraded.

Moreover, these methods are similar to the overetching of the passivation layer 200. As illustrated in FIG. 1B, complete etching of the passivation layer 200 very often leads to unintentionally consuming the surface of the AlGaN layer 100.

Furthermore, these known methods are sensitive to the charge effects caused by the consumption of the reactive neutral species, thus leading to a reduction in the concentration thereof in the gaseous phase ("macroloading") or locally on the scale of the microscopic structure ("microloading"). These phenomena therefore lead to non-uniformities of etching on the macroscopic or microscopic scale. These phenomena lead to great heterogeneities in etching and implantation within the same wafer, according to the density of the patterns.

All these drawbacks lead to degrading the AlGaN layer 100 and reducing the performances of the device.

There is therefore a need to propose a solution for removing a passivation layer on top of an AlGaN layer, while limiting or even eliminating the defects caused by the known solutions.

This is an objective of the present invention.

SUMMARY

In order to achieve this objective, according to one embodiment the present invention provides a method for etching a dielectric layer situated on at least one layer based on gallium nitride (GaN), the dielectric layer being formed by a material based on one from SixNy and SixOy with x and y integers, the method comprising at least the following steps:

first etching of the dielectric layer on only part of a thickness $e_{200}$ of the dielectric layer in order to define, in the dielectric layer, at least one partial opening and at least one residual portion situated in line with the opening and having a thickness $e_{202}$;

implantation of ions in line with the partial opening over a thickness greater than the thickness $e_{202}$ so as to:
modify the material of the dielectric layer in line with the opening over the entire thickness $e_{202}$ of the residual portion;
modify the material of the layer based on GaN over a portion of the layer based on GaN situated in line with the opening;
preferably preserving non-modified portions of the dielectric layer situated on either side of the opening;

removal of the residual portion by means of a second etching, the second etching being selective of the modified material of the dielectric layer vis-à-vis the non-modified material of the dielectric layer and vis-à-vis the modified material of the layer based on GaN;

annealing at least of the layer based on GaN for a period greater than D1 and a temperature lying between T1 and T2, with D1=30 s, T1=300° C. and T2=900° C., preferably 600° C.

Thus, after a partial etching phase, this method involves implanting ions based on hydrogen and helium in the entire residual thickness and beyond the interface between the dielectric layer and the layer based on GaN (GaN-based layer).

The implantation of the ions based on hydrogen or helium makes it possible to very significantly increase the selectivity of the etching of the dielectric layer vis-à-vis non-modified portions of the dielectric layer and vis-à-vis the GaN-based layer.

The implantation of the ions carried out beyond the interface between the dielectric layer and the GaN-based layer makes it possible to ensure that the entire dielectric layer is actually implanted. It is thus possible to easily remove the entire dielectric layer without risking residues of this layer remaining on the surface of the GaN-based layer. Thus the method proposed makes it possible to remove all the dielectric layer situated in line with the opening while relaxing the constraints with respect to different methods that would require stopping the implantation of the dielectric layer before the GaN-based layer.

Moreover, whereas the GaN-based layer is greatly damaged by the implantation, the annealing, with the parameters mentioned above, makes it possible to obtain a material based on GaN the properties of which are close to those that this material had before implantation. Typically, the electrical properties of the zone of the material based on GaN implanted and then subjected to annealing are identical to, or very close to, those of this same material after epitaxial growth.

It should be noted that this type of annealing did not give satisfactory results when the etching for opening the dielectric layer is based on fluorocarbon chemistry.

Moreover, it should be noted that, if use is made of a resist mask for opening the dielectric layer, it is possible to remove this resist mask before removing the residual thickness of the dielectric layer. Thus, during the step of etching the resist (basically designated by the term stripping), typically by means of an oxygen-based plasma, the GaN-based layer is protected by this residual thickness. Oxidation of the GaN-based layer situated in line with the opening is thus avoided.

On the other hand, in the known methods illustrated in FIGS. 1A to 1C removal of the resist mask 300 leads to oxidising the uncovered surface of the layer of AlGaN 100 in the zone 101.

The method proposed therefore offers significant advantages compared with the known methods and leads to considerably improving the performances of the devices based on GaN. Moreover, this device is reliable, easily reproducible and inexpensive.

BRIEF DESCRIPTION OF THE FIGURES

The aims, objects, features and advantages of the invention will emerge more clearly from the detailed description of embodiments thereof that are illustrated by the following accompanying drawings, in which.

Figure 1A:
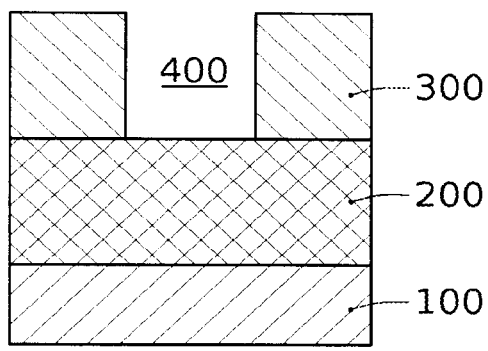
FIGS. 1A to 1C illustrate the main steps of the known methods.
Figure 1B:
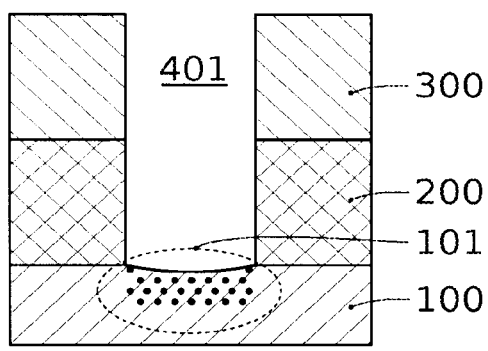
Figure 1C:
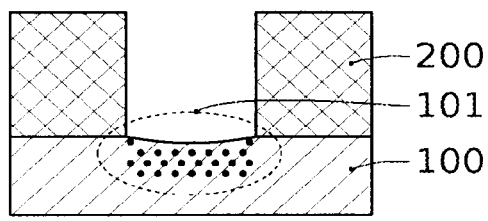

The drawings are given by way of examples and are not limitative of the invention. They constitute schematic outline representations intended to facilitate understanding of the invention and are not necessarily to the scale of the practical applications. In particular, the relative thicknesses of the various layers and films do not represent reality.

DETAILED DESCRIPTION

Before beginning a detailed review of embodiments of the invention, optional features, which may optionally be used in association or alternatively, are stated below:

According to one example, the first etching is based on fluorocarbon chemistry.

According to one example, the thickness e202 of the residual portion is between 10 nm and 30 nm, and preferably between 5 nm and 30 nm. A limit value for the plasma implantation is 30 nm. A greater implantation depth may lead to increasing the biasing voltage, which risks consuming part of the residual portion by sputtering.

According to an example embodiment, the thickness e202 of the residual portion is greater than 4 nm and preferably greater than 10 nm.

This makes it possible not to damage the underlying layer during the first etching of the dielectric layer. This is because, during this first etching, it is certain that the underlying layer will not be reached.

According to one example, said portion of the layer based on GaN situated in line with the opening and the material of which is modified during the implantation has a thickness e102 greater than 4 nm, e102 preferably being between 5 nm and 30 nm.

According to one example, the implantation is carried out by means of a plasma.

Alternatively, the implantation is carried out by implanters.

Preferably, said ions being based on hydrogen (H) and/or helium (He).

The implanted ions are preferably taken from the following ions: H, $H^+$, $H_2^+$, $H_2^+$, $H_3^+$, He+.

According to one example, the annealing is carried out at ambient pressure (P atmosphere). According to one example, the dielectric layer is situated directly in contact with the layer based on GaN.

According to one example, the layer based on GaN is made from a material based on gallium nitride (GaN).

According to another example, the layer based on GaN is AlGaN, the layer based on GaN made from AlGaN lying on top of a layer of GaN.

According to one example, the dielectric layer is made from $Si_xN_y$, preferably silicon nitride (SiN), and the dielectric layer is deposited at a temperature greater than or equal to 500° C. According to another example, the dielectric layer is made from $Si_xO_y$, preferably silicon dioxide ($SiO_2$), and the dielectric layer is deposited at a temperature greater than or equal to 500° C.

According to one example, the method according to the invention comprises the following steps prior to the first-etching step:

deposition of a layer of resist on top of the dielectric layer,
opening of the layer of resist in order to form a resist mask,
said first etching of the dielectric layer in order to define, in the dielectric layer, at least one partial opening being carried out through said resist mask.

According to one example, after said implantation and before the removal of the residual portion, a removal of the resist mask, preferably, the removal of the resist mask is carried out at least partly by an oxygen-based plasma.

Advantageously, the residual portion protects the layer based on GaN during the removal of the resist mask. In this way, the layer based on GaN undergoing surface oxidation is avoided.

According to one example, the method according to the invention comprises, after said first etching of the dielectric layer and before said implantation, at least the formation of a protective film on the resist mask.

According to one example, the protective film is formed by the deposition of a polymer material.

According to one example, the protective film is formed by a conforming deposition based on fluorocarbon chemistry, the protective film being made from $C_{x0}H_{y0}F_{z0}$, with x0, y0, and z0 being non-zero integers.

According to one example, said implantation is carried out in a principal direction and by putting the dielectric layer in the presence of a plasma in which Cx1Hy1 is introduced, where x1 is the proportion of carbon (C) and y1 is the proportion of hydrogen (H), and comprising ions heavier than hydrogen; the conditions of the plasma, in particular the concentration of Cx1Hy1, the energy of the ions and the principal implantation direction being chosen so that:

the plasma creates a bombardment of ions based on hydrogen (H, H+, $H_2$+, $H_3$+ etc.) coming from the Cx1Hy1 in the principal direction, chemical species of the plasma containing carbon coming from CxHy form a protective carbonaceous film in particular on surfaces parallel to the direction of bombardment;

the plasma creates a bombardment of the ions heavier than hydrogen that prevent said chemical species of the plasma containing carbon and coming from the Cx1Hy1 from forming a carbonaceous protective film, in particular on the surfaces of the resist mask that are perpendicular to the principal direction of bombardment.

According to one example, at least two of the following steps or preferably all the following steps are carried out in the same reactor, preferably a plasma reactor:

said first etching,
said implantation,
said second etching.

This makes it possible to shorten the production cycles and to considerably reduce production costs.

A substrate, film or layer "based" on a material A, means a substrate, film or layer comprising a material A solely or this material A and optionally other materials.

Thus, in the present description, a layer based on GaN may be a layer consisting solely of GaN or a layer comprising GaN and other elements. Typically it may be a layer of AlGaN, InGaN or AlInGaN.

According to one example, the layer based on GaN comprises GaN and one or more elements from column III or column V of the periodic table of elements.

According to one example, the layer is AlGaN or doped AlGaN. It may also be GaN or doped GaN. The doping of the GaN or AlGaN may be carried out with at least one of the following species: Mg, Si, P, O, Ca, C.

Likewise, in the present description, a material based on one from SixNy and SixOy with x and y integers may for example be one of the following materials: SiN, $Si_3N_4$, $SiO_2$, SiCO, SiOCH, SiOCN, SiCBN.

The word "dielectric" qualifies a material the electrical conductivity of which is sufficiently low in the given application to serve as an electrical insulator.

In the context of the present invention, the terms "on", "surmounts", "covers", "underlying", "facing" and the equivalents thereof do not necessarily mean "in contact with". Thus, for example, the deposition, transfer, bonding, assembly or application of a first layer or a second layer does not necessarily mean that the two layers are directly in contact with one another but means that the first layer at least partially covers the second layer while being either directly in contact therewith or being separated therefrom by at least one other layer or at least one other element.

A layer may moreover be composed of a plurality of sub-layers of the same material or different materials. Thus a layer based on GaN may comprise a stack of layers based on GaN. A layer based on GaN may thus comprise a layer of AlGaN situated on, preferably directly in contact with, a layer made from GaN.

The term "step" does not necessarily mean that the actions performed during the step are simultaneous or immediately successive. Some actions of a first step may in particular be followed by actions related to a different step, and other actions of the first step may be repeated thereafter. Thus the term step does not necessarily mean unitary actions inseparable in time and in the concatenation of the phases of the method.

In the context of the present invention, a resist is an organic or organo-mineral material which can be shaped by exposure to a beam of electrons or photons or X-rays or mechanically.

Mention can be made by way of example of resists conventionally employed in microelectronics, resists based on polystyrene (PS), methacrylate (for example polymethylmethacrylate PMMA), hydrosilsesquioxane (HSQ), polyhydroxystyrene (PHS) etc. The advantage of using a resist is that it is easy to deposit a large thickness thereof, from several hundreds of nanometres to several microns.

In the context of the present invention, the thickness of a layer or substrate is measured in a direction perpendicular to the surface along which this layer or substrate has its maximum extension.

In the figures, the thickness is taken along the vertical.

Likewise, when it is indicated that an element is situated in line with or vertically in line with another element, this means that these two elements are both situated on the same line perpendicular to the main plane of the substrate, that is to say on the same line oriented vertically in the figures.

A first embodiment of the present invention will now be described in detail with reference to FIGS. 2 and 3A to 3F.

The initial stack comprises at least one layer based on GaN 100 surmounted by at least one dielectric layer 200.

The layer based on GaN 100 is preferably supported by at least one supporting substrate, not illustrated in the figures.

The layer based on GaN 100 may be a homogeneous layer or a stack of layers based on GaN, for example a layer comprising AlGaN. The layer based on GaN may be non-doped or doped. In this case it will be able to be doped by at least one of the following species: Mg, Si, P, O, Ca, C.

Preferably, the layer based on GaN 100 is disposed directly in contact with the dielectric layer 200.

The dielectric layer 200 is formed by a material based on one from SixNy and SixNy, x and y being integers.

Preferably, the layer based on GaN 100 has a thickness e100 greater than or equal to 10 nm ($10^{-9}$ metres) and preferably greater than or equal to 20 nm. Generally e100 is between 10 nm and 40 nm. Preferably 25 nm.

Preferably, the dielectric layer 200 has a thickness e200 greater than or equal to 40 nm and preferably greater than or equal to 50 nm. Generally e200 is between 50 nm and 100 nm, and preferably between 75 and 85 nm. The layers 100 and 200 lie mainly in parallel planes. Their thicknesses e100, e200 are therefore measured in a direction perpendicular to these planes.

Preferably but non-limitatively, the dielectric layer 200 is deposited at a temperature greater than or equal to 500° C.

The method that will be described hereinafter makes it possible to obtain a particularly precise etching of a dielectric layer 200 deposited at a temperature above 500° C. and preferably above 550° C.

According to one embodiment, the dielectric layer 200n, for example of SiN, is deposited in situ by MOCVD (organometallic vapour epitaxy) at 1050° C. and is supplemented by a CVD (chemical vapour deposition), preferably at low pressure (LPCVD) at more than 700° C.

A first step (step E1) consists of producing a partial opening 401 in the dielectric layer 200. Partial opening means a non-through opening, or the production of a hollow pattern that leaves a residual portion 202 in place.

This partial opening 401 is produced by lithography. For this purpose, prior to the opening of the dielectric layer 200, a layer, for example a layer of resist, will have been deposited. At least one opening 400, preferably through, is produced in the layer of resist in order to form a resist mask 300.

The partial opening 401 of the dielectric layer 200 is produced by etching through the resist mask 300.

This etching is preferably carried out using fluorocarbon chemistry. In this case, it is possible to use a capacitive coupling plasma (CCP) reactor or an inductive coupling plasma (ICP) reactor.

This etching is carried out so as to preserve, in the bottom of the hollow pattern produced in the dielectric layer 200, a residual portion 202. This residual portion 200 has a thickness e202 sufficient to block the species of the chemical etching, so that these species do not penetrate the layer based on GaN 100. Thus the incorporation of fluorine in the layer based on GaN 100 is avoided. Moreover, the residual portion 200 also prevents all other modifications, such as stoichiometric, structural or electrostatic modifications, of the GaN that may be caused by plasma etching.

Thus e202 is greater than 4 nm. Preferably e202 is between 5 nm and 30 nm.

Figure 3A:
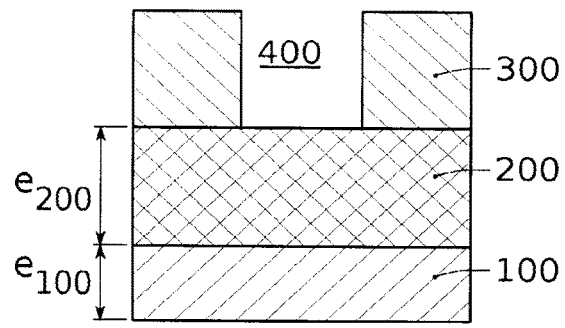
FIGS. 3A to 3F illustrate schematically the main steps of a method according to a first embodiment of the present invention.
Figure 3B:
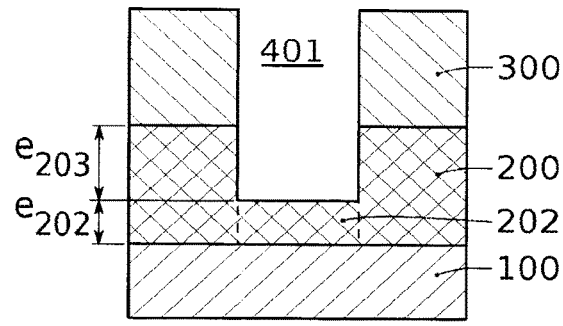

In FIG. 3B, the thickness e203 corresponds to the etched thickness of the layer 200 during this partial opening step. Thus e200=e202+e203.

Figure 2:
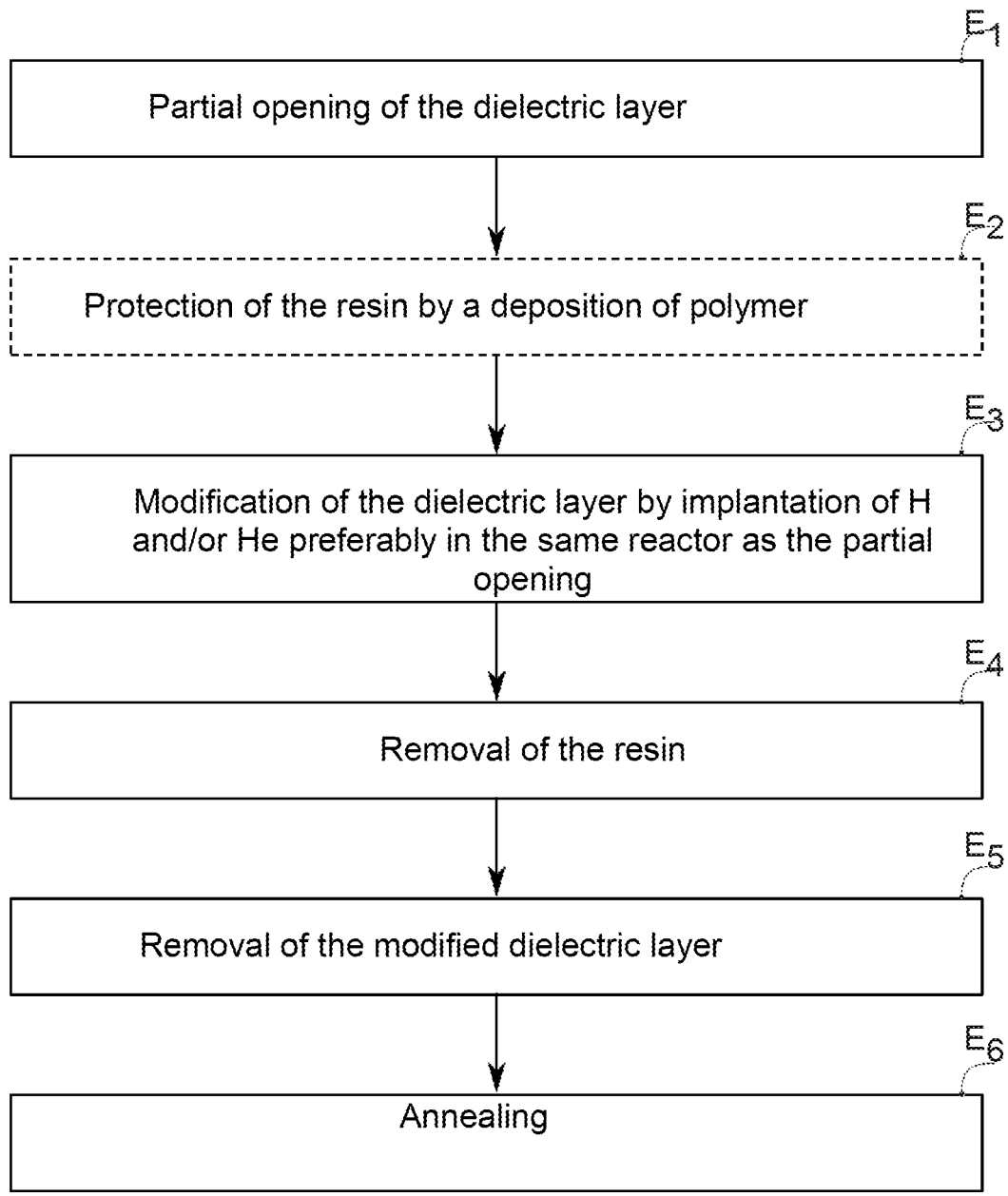
FIG. 2 illustrates, in the form of a flow diagram, the main steps of a method according to one embodiment of the present invention.
Figure 3C:
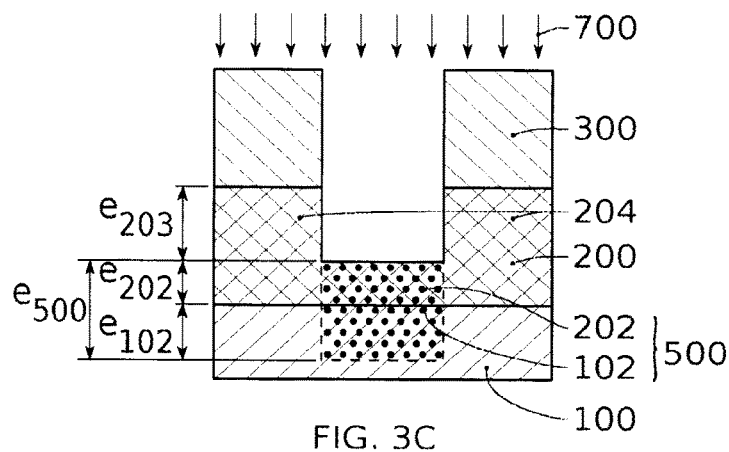

The following step illustrated in FIG. 3C (step 3 illustrated in FIG. 2), consists of modifying, by implantation 700 of species, in particular ions, the residual portion 202 over the entire thickness e202 thereof. Moreover, this modification is made without there being any need to stop the implantation before the layer based on GaN 100. Thus, during the implantation 700, species also penetrate the layer based on GaN 100.

Thus the implantation 700 is configured, in particular the direction thereof and the energy of the ions, so as not to stop on the bottom face of the dielectric layer 200 but so as to continue into the layer based on GaN 100.

Thus a zone 102 of the layer based on GaN 100 is implanted. This zone 102 is situated in line with the partial opening 401. This zone 102 has a thickness e102.

The thickness e102 is greater than 4 nm. Preferably, e102 is between 5 nm and 30 nm. Preferably e102 is less than the total thickness e100 of the layer based on GaN 100 in line with the opening 401.

Thus the implantation 700 is carried out in a zone 500 comprising the residual portion 202 and the zone 102. The total thickness e500 of the implanted zone 500 is therefore equal to e500=e102+e202.

Preferably the modification by implantation 700 is anisotropic. It is carried out in an implantation direction parallel to the principal direction of the partial etching. The partial etching defines an opening 401 and delimited by flanks perpendicular to the main planes in which the layers 100 and 200 extend. The principal direction of implantation 700 is parallel to these flanks. Thus the ions are implanted in line with the opening 401. They are therefore implanted in the residual portion 202 and in the zone 102 situated vertically in line with the partial opening 401. The regions 204 adjacent to the residual portion 202 and to the zone 102 are not implanted.

Thus the method proposed does not require stopping the implantation precisely at the interface between the dielectric layer 200 and the layer based on GaN 100, or on a bottom face of the dielectric layer 200 if there exists an intermediate layer between the layer based on GaN 100 and the dielectric layer 200. This makes it possible to ensure that the entire dielectric layer 200, situated in line with the opening 401, is actually implanted.

The parameters of the implantation 700 of the dielectric layer 200 are adjusted, in particular the nature and the concentration of the ions as well as the energy of the ions, so that the speed of etching of the modified material of the dielectric layer 200 is greater than that of the non-modified material of the dielectric layer 200. The modification step thus makes it possible to increase the selectivity of the etching of the dielectric layer 200, in the modified residual portion 202, vis-à-vis non-modified portions of the dielectric layer 202.

Typically, this modification comprises the implantation of ions based on hydrogen (H, H+, $H_2$+, $H_3$+, etc.). According to another embodiment, the implanted ions are helium ions (He) or a mixture of helium and hydrogen ions (H/He). These ions may for example come from the following gases introduced into the reactor: $H_2$, HBr; $NH_3$.

These ions are implanted in a reactor or in an implanter. Examples of implantation will be described hereinafter.

Figure 3D:
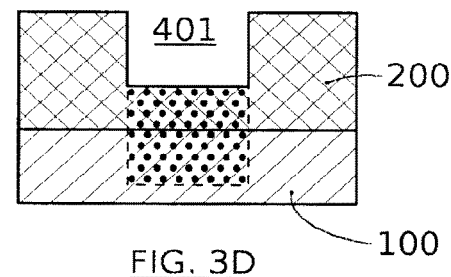

FIG. 3D illustrates the removal of the resist mass 300 (step E4 illustrated in FIG. 2). This step, normally referred to by the term stripping, comprises for example an etching by oxygen plasma. This etching may be followed by wet cleaning enabling the etching residues to be removed. For example, a solution of the EKC265 type supplied by the company DuPont™, based on active organic agents such as a nucleophilic agent, a reducing agent and a chelating agent.

It should be noted that, during this step E4, the layer based on GaN 100 remains masked by the residual portion 202. The layer based on GaN 100 therefore does not undergo oxidation during this step of stripping the resist mask 300. This represents a significant advantage compared with the known solutions in which the step of stripping the resist mask leads to oxidising and therefore impairing the layer of AlGaN.

Figure 3E:
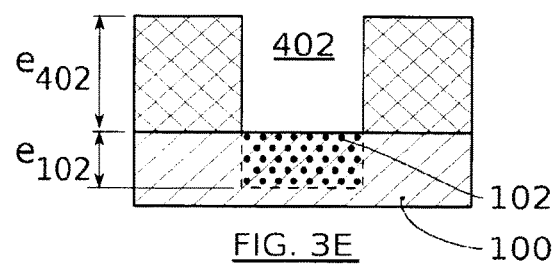

FIG. 3E illustrates the removal of the residual portion 202 selectively with regard to the non-modified portions 204 of the dielectric layer 200 and to the layer based on GaN 100 (step E5 illustrated in FIG. 2).

Preferably, the selective etching of the residual portion 202 formed from the modified dielectric material is obtained by means of a solution based on hydrofluoric acid (HF) or by means of a solution based on phosphoric acid $H_3PO_4$).

By way of example, for a dielectric layer of SiN, with a solution based on hydrofluoric acid (HF), the ratio of etching speed between modified SiN and non-modified SiN is around 30. By way of example also, the ratio of etching speed between modified SiN and modified AlGaN is >5. Unexpectedly, it turns out that the consumption by a solution based on HF of AlGaN modified by implantation is very low or even zero.

Other examples of selective-etching steps will be described in detail hereinafter.

The entire thickness e202 of the residual portion 202 having been modified by implantation, the whole of this thickness is removed during the selective etching. The opening 402 of the dielectric layer 200 is then a through opening. A top face of the layer based on GaN 100 is therefore bared in line with the opening 402.

The following step (step E6 illustrated in FIG. 2) consists of carrying out an annealing of the stack comprising the layer based on GaN 100.

This annealing is carried out under the following conditions:
- temperature above 200° C., preferably between 300° C. and 900° C.;
- duration greater than 30 seconds, preferably between 1 minute and 5 minutes;
- pressure between 1 bar and $10^{-8}$ bar and advantageously atmospheric pressure.

Whereas the layer based on GaN is highly impacted by the implantation, annealing with the parameters mentioned above makes it possible to obtain a material based on GaN the properties of which are close to those that this material had before implantation. Typically the electrical properties of the zone of the material based on GaN implanted and then subjected to annealing are identical to, or very close to, those of the same material after epitaxial growth.

It should be noted that this type of annealing did not give satisfactory results when the etching for opening the entire thickness of the dielectric layer is based on a fluorocarbon chemistry.

Two particular examples will now be described. In each of these examples the following will be mentioned:
- in a first table the plasma implantation conditions that led to the modification of the zone 102 of the layer based on GaN 100;
- the layer resistance $R_{sheet}$ measured after implantation but before the annealing step,
- According to one embodiment, for an AlGaN/GaN or AlGaN/AlN/GaN heterostructure, $R_{sheet}$ is the resistance of the bidimensional electron channel, present on the surface of the GaN, at the AlGaN/GaN or AlGaN/AlN interface. The layer 100 is AlGaN and it is wished to measure the resistance of the 2 DEG that forms underneath (not shown in the graphs).
- in a second table the conditions of the annealing applied to the layer based on GaN 100,
- the resistance of the layer $R_{sheet}$ measured for the layer based on GaN 100 after annealing.

The layer resistance, normally designated by $R_{sheet}$, is expressed in $\Omega/\square$ or $\Omega \cdot m$. The layer resistance $R_{sheet}$ is measured for example by the known four points method. In each of the examples below, the nature of the layer based on GaN 100 is identical. It is made from AlGaN. By comparison with the examples that follow, the layer resistance $R_{sheet}$ of the electron channel that forms in the presence of the AlGaN/GaN (or AlGaN/AlN/GaN) heterostructure, after epitaxial growth but before the implantation and annealing steps of the method proposed, is $350\Omega/\square$.

TABLE 1

Example 1
Implantation of the layer based on GaN 100

| | |
|---|---|
| Material of the layer based on GaN | AlGaN |
| Modified thickness e102 of the layer based on GaN | A new nanometres |
| Nature of the gas injected into the reactor in order to form the plasma | Gas based on helium, typically (He) |
| Flow rate of the gas injected into the reactor | 50 sccm |
| Power of the source: | 600 watts |
| Power of the biasing (bias): | 30 watts |
| Biasing voltage (bias): | 45 V |

TABLE 1-continued

Example 1
Implantation of the layer based on GaN 100

| | |
|---|---|
| Pressure:: | 10 millitorr |
| Duration: | 200 s |

TABLE 2

| | |
|---|---|
| $R_{sheet}$ for the layer based on GaN measured before annealing | |
| $R_{sheet}$ | Not measurable |

TABLE 3

| Annealing | |
|---|---|
| Temperature of the annealing: | 600° C. |
| Duration | 20 minutes |
| Gas | $N_2$ |
| Pressure: | Atmospheric pressure |

TABLE 4

| | |
|---|---|
| $R_{sheet}$ for the layer based on GaN measured after annealing | |
| $R_{sheet}$ | 361 $\Omega/\square$ |

TABLE 5

Example 2
Implantation of the layer based on GaN 100

| | |
|---|---|
| Material of the layer based on GaN | AlGaN |
| Modified thickness e102 of the layer based on GaN: | A few nanometres |
| Nature of the gases injected into the reactor to form the plasma | $CF_4/CH_2F_2/O_2/He$ |
| Flow rate of the gases injected into the reactor | $CF_4$: 27 sccm<br>$CH_2F_2$: 50 sccm<br>$O_2$: 27 sccm<br>He: 100 sccm |
| Power of the source: | 400 watts |
| Power of the biasing (bias): | 70 watts |
| Biasing voltage (bias): | 420 V |
| Pressure: | 32 millitorr |
| On etching | 64% expressed as % of the actual etching time |
| Duration: | According to the thickness of the dielectric layer. 18 seconds for example, on etching included for 10 nm of SiN with the above conditions |

TABLE 6

| | |
|---|---|
| $R_{sheet}$ for the layer based on GaN measured before annealing | |
| $R_{sheet}$ | Not measurable |

TABLE 7

| Annealing | |
|---|---|
| Temperature of the annealing: | 600° C. |
| Duration | 20 minutes |

TABLE 7-continued

Annealing

| Gas | $N_2$ |
|---|---|
| Pressure: | Atmospheric pressure |

TABLE 8

| $R_{sheet}$ for the layer based on GaN measured after annealing | |
|---|---|
| $R_{sheet}$ | 975 Ω/□ |

It is clear from these examples that, after implantation 100 and before annealing, the electrical characteristics of the layer based on GaN 100, in particular the layer resistance $R_{sheet}$, is very greatly degraded. On the other hand, annealing makes it possible to obtain a material based on GaN the properties of which are close to the post-epitaxy material.

Two alternative embodiments will now be described with reference to FIGS. 4A to 4F, 5A to 5G and FIG. 2.

In these two alternative embodiments, the objective is to avoid, during implantation, a modification of the sides of the resist mask 300 under the effect of the bombardment.

These two alternative embodiments are identical to the embodiments described previously with reference to FIGS. 3A to 3F with the exception of the steps that will be specified. Thus all the features, steps, technical effects and advantages mentioned previously apply to these two alternative embodiments.

A first alternative embodiment will be described with reference to FIGS. 4A to 4F.

Figure 4A:
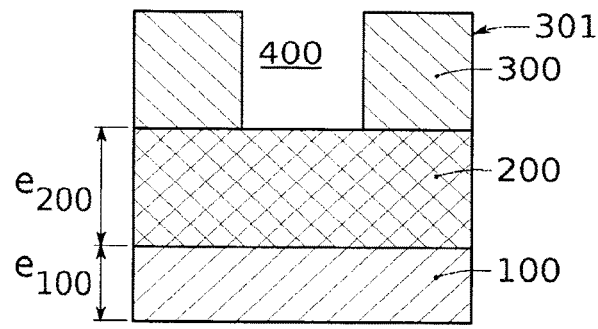
FIGS. 4A to 4F illustrate schematically the main steps of a method according to a second embodiment of the present invention.
Figure 4B:
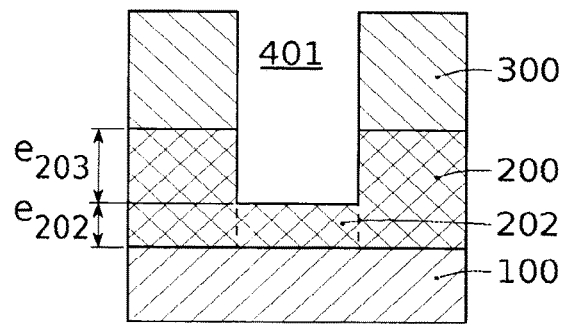
Figure 4C:
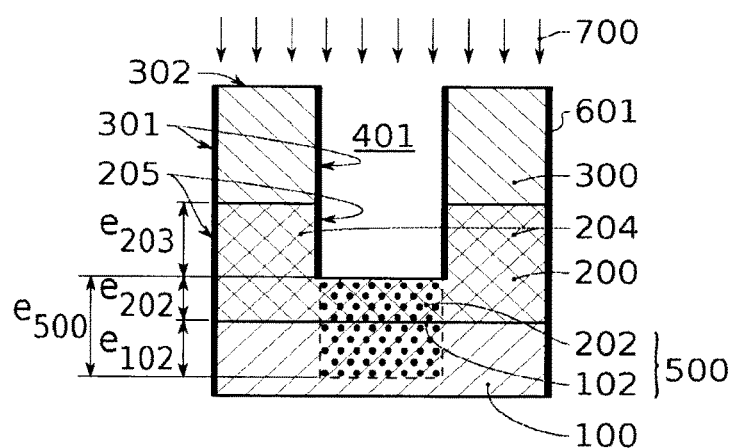

The steps illustrated in FIGS. 4A and 4B are identical to the steps described with reference to FIGS. 3A and 3B.

This embodiment differs from the one described previously in that, in the modification step E3, the implantation 700 leads to forming, on the surfaces parallel to the principal direction of implantation, a protective film 601. Thus, on the flanks 301 of the patterns of the resist mask 300 and on the uncovered flanks 205 of the dielectric layer 200, a protective film 601 is formed. This protective film 601 is a carbonaceous film. It protects these flanks 301, 205 during the modification step, which makes it possible to improve the dimensional control of the resist mask 300 and of the hard mask formed by the dielectric layer 200.

According to an example embodiment, in the step E3 of modification by implantation, the residual portion 202 is put in the presence of a plasma in which Cx1Hy1 is introduced, where x1 is the proportion of carbon and y1 is the proportion of hydrogen (H). This plasma also comprises ions heavier than hydrogen. The conditions of the in plasma, in particular the concentration of Cx1Hy1, the energy of the ions and the principal direction of implantation are chosen so that:

the plasma creates a bombardment of ions based on hydrogen (H, $H^+$, $H_2^+$, $H_3^+$ etc.) coming from $Cx_1Hy_1$, the bombardment being anisotropic in a privileged direction parallel to the flanks 301 of the resist mask 300, chemical species of the plasma containing carbon coming from CxHy form the carbonaceous protective film 601, in particular on surfaces parallel to the direction of the bombardment, such as the flanks 301 of the resist mask 300;

the plasma creates a bombardment of the ions heavier than hydrogen that prevents said chemical species of the plasma containing carbon and coming from $Cx_1Hy_1$ from forming a carbonaceous protective film 601 in particular on the surfaces perpendicular to the direction of the bombardment. These surfaces perpendicular to the direction of the bombardment comprise in particular the top face of the residual portion 202.

Particularly advantageously, it was found that the bombardment of ions heavier than hydrogen such as He enables the chemical species of the plasma containing carbon coming from Cx1Hy1 to form the carbonaceous film in particular on surfaces parallel to the direction of the bombardment and moreover prevents the chemical species containing carbon from forming a carbonaceous film on the surfaces of the dielectric layer 200 that are perpendicular to the direction of the bombardment.

The bombardment of ions heavier than hydrogen in fact destroys the carbonaceous protective film 601 that would have a tendency to be deposited on the bottom of the opening 401 that is perpendicular to the direction of the bombardment.

During the removal step E4, this etching etches the surfaces of the modified residual portion 202 that are not covered with the carbonaceous film.

It should nevertheless be noted that the top face 302 of the layer of resist may be protected by this protective film 600. This is because, the layer of resist being a carbonaceous layer, the carbon atoms coming from Cx1Hy1 are very quickly deposited on this layer of resist and adhere thereto by chemical affinity. The ion bombardment therefore does not suffice to prevent the formation of this carbonaceous film. This carbonaceous film therefore protects the top face of the layer of resist.

Thus this embodiment makes it possible to effectively protect the resist mask 300 by virtue of the protective film 601 while making it possible to implant the residual portion 202.

This protective film 601 has a thickness of less than 5 nm and preferably less than 3 nm.

According to one example, the modification step of step E3 is performed so that the ions heavier than hydrogen of the plasma dissociate the molecule of Cx1Hy1 so as to enable the hydrogen ions (H) coming from Cx1Hy1 to form ions based on hydrogen and to be implanted in the residual portion 202 of the dielectric layer 200 in order to modify same.

According to a particular non-limitative example, the Cx1Hy1 is $CH_4$ and the ions heavier than hydrogen are ions based on helium (He).

According to one example, the $CH_4$ and He gases are injected into the plasma reactor.

The carbon of the $CH_4$ will make it possible to passivate the flanks 301 of the resist mask 300, forming the protective film 601.

The carbon in the bottom of the patterns, in particular on the free face of the residual portion 202, do not manage to form a layer since it is sputtered by the He ions.

The ions based on H are implanted in the entire thickness of the residual portion 202 as well as in part of the layer based on GaN 100 in order to define the zone 102.

Figure 3F:
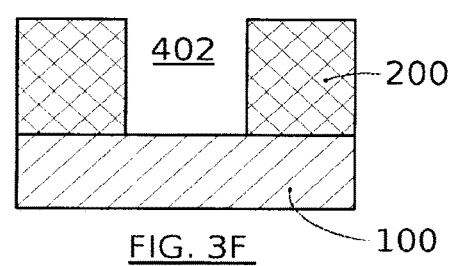
Figure 4D:
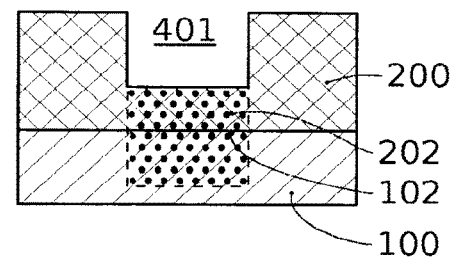
Figure 4E:
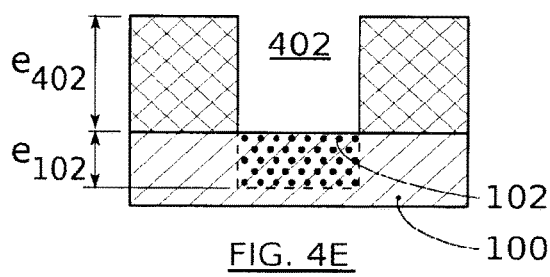
Figure 4F:
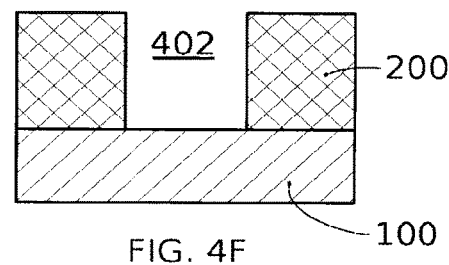

According to other examples, the ions heavier than hydrogen may comprise ions based on one from: argon (Ar), nitrogen ($N_2$), xenon (Xe) and oxygen ($O_2$). The steps illustrated in FIGS. 4D to 4F are identical to the steps described with reference to FIGS. 3D and 3F.

The protective film 601 is removed during the step E4 of removing the resist mask 300.

The removal step E5 is performed so as to selectively remove the modified residual portion 202 vis-à-vis the non-modified dielectric layer 204 and vis-à-vis the carbonaceous protective film 601.

This embodiment illustrated with reference to FIGS. 4A to 4F is applicable both to the dielectric layers 200 formed from a material based on SixNy and to that based on SixOy.

A second alternative embodiment will now be described with reference to FIGS. 5A to 5F and 2.

Figure 5A:
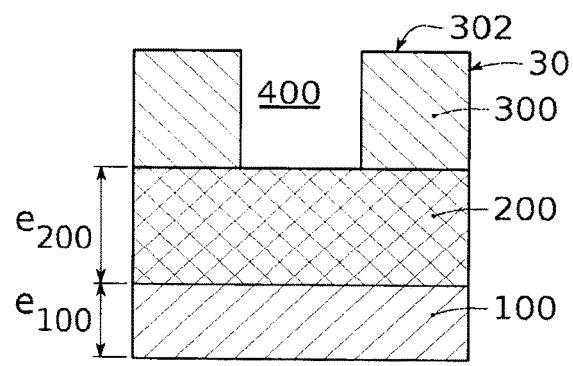
FIGS. 5A to 5G illustrate schematically the main steps of a method according to a third embodiment of the present invention.
Figure 5B:
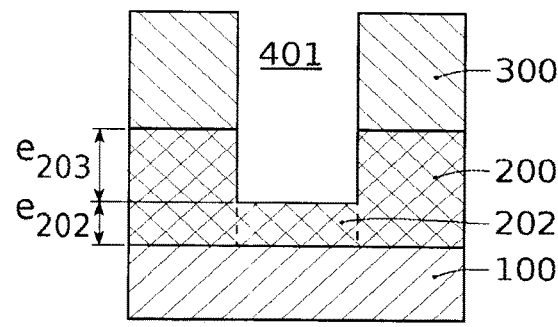

The steps illustrated in FIGS. 5A and 5B are identical to the steps described with reference to FIGS. 3A and 3B.

This embodiment differs from the one described previously in that, after the step E1 of partial opening of the dielectric layer 200 and before the modification step E3, the method comprises a step of protecting the resist mask 300 by depositing a protective layer 602. This step, solely optional, is referenced E2 in FIG. 2.

Figure 5C:
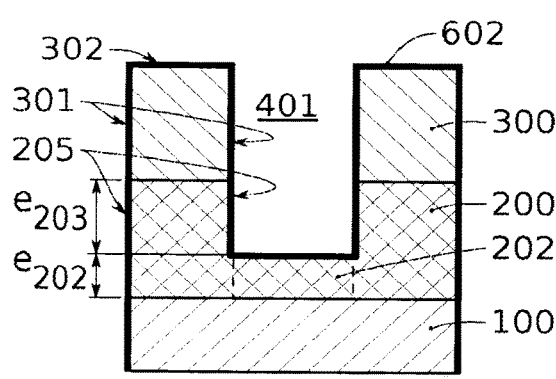

As illustrated in FIG. 5C, the protective film 602 is preferably deposited in a conforming manner. Thus it covers the flanks 301 and the tops 302 of the mask 300 as well as the flanks 205 of the dielectric layer 200. This protective film 602 also covers the top face of the residual portion 202.

Preferably, this protective film 602 is deposited in the same reactor as the one that was used to perform the step E1 of partial opening of the dielectric layer and/or in the same reactor as the one that will be used during the modification step E3.

This protective film 602 is preferably a polymer.

According to one example, this deposition is performed using a fluorocarbon chemistry. The protective film 602 deposited is then based on Cx0Hy0Fz0, x0, y0 and z0 being integers.

This protective film 602 has a thickness of less than 10 nm and preferably less than 5 nm.

Figure 5D:
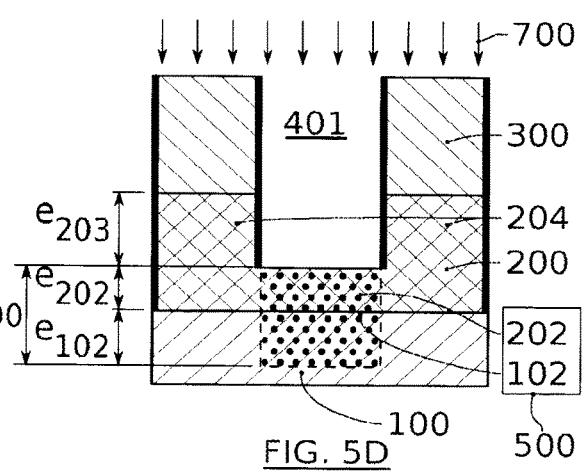

Thus, in the modification step E3, the bombardment of the ions sputters this protective film 602. Thus, as illustrated in FIG. 5D, during the implantation 700 this protective film 602 disappears on the surfaces that are not parallel to the principal implantation direction. The protective film 602 therefore disappears on the top face of the resist mask 300 as well as in the bottom of the opening 401 formed by the top face of the residual layer 202. This protective film 602 then does not block the implantation of the ions in the residual layer 202 and in part of the layer based on GaN 100.

However, the ion bombardment does not sputter the protective film 602 deposited on the surfaces parallel to the direction of this bombardment. Thus the flanks 301 of the resist mask 300 remain protected by this protective film 602 during the implantation 700. This protective film 602 therefore preserves the sides of the resist mask 300.

According to one example, the protective film 602 is removed during the step E4 of removal of the resist mask 300. For example, removal of the protective film 602 can thus be performed with the same chemistry as that used for removing the resist mask 300. Thus it will be possible for example to use an oxygen plasma followed by wet cleaning.

Figure 5E:
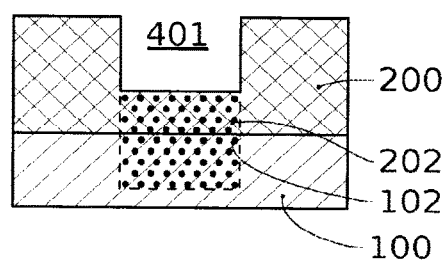

Thus the result of step E4, illustrated in FIG. 5E, is identical to the results illustrated in FIG. 3D.

Figure 5F:
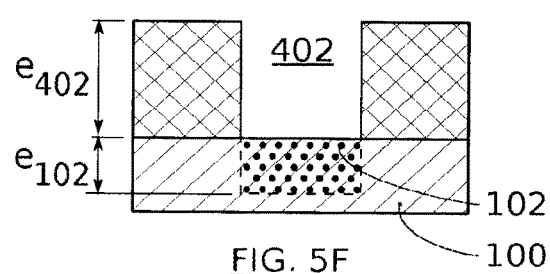
Figure 5G:
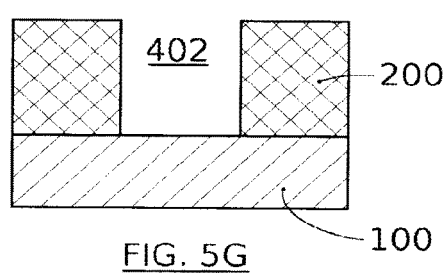

Furthermore, the steps illustrated in FIGS. 5F and 5G are identical to the steps described with reference to FIGS. 3E and 3F.

This embodiment, illustrated with reference to FIGS. 5A to 5G, is applicable both to the dielectric layers 200 formed from a material based on SixNy and to those based on SixOy.

The following paragraphs present various embodiments for implementing the step E3 of modification by implantation of the dielectric layer 200 and the step E5 of removing the dielectric layer modified by implantation selectively with regard to the non-modified dielectric layer.

Modification of the Dielectric Layer 202

As mentioned above with reference to FIGS. 3C, 4C, 5D, the anisotropic modification of the residual portion 202 of the dielectric layer 200 is performed by an anisotropic implantation 700 of ions.

As indicated above, one advantage of the method proposed is that it is not necessary to stop the implantation before the layer based on GaN 100. This makes it possible to ensure that the entire thickness of the dielectric layer 200 is modified while relaxing the method constraints.

According to a first example, the anisotropic implantation 700 may be performed in a conventional implanter (normally designated as "beamline"), that is to say with an implantation by ion beam.

The direction of implantation remains constant throughout the implantation. This direction is parallel to the flanks 301 of the resist mask 300 and to the flanks 205 of the dielectric layer 200.

The implanted species may be argon (Ar), fluorine (F), oxygen (O) or hydrogen (H).

At the following step, the modified portions 202 of the dielectric layer 200 can thus be removed by etching selectively vis-à-vis the layer based on GaN 100 and vis-à-vis the non-modified portions 204 of the dielectric layer 200. This etching is preferably a wet etching since it is gentler for the underlying layers. For example, this etching is based on an HF chemistry. Alternatively, this etching may be a dry etching.

Typically, the dose implanted by ion beam is greater than 1E13 atoms per square centimetre (at/cm$^2$). It will more generally be between 1E14 and 1E17 at/cm$^2$.

These implantation conditions are for example determined by simulation using simulation tools of the SRIM (stopping and range of ions in matter) or TRIM (transport simulation of ions in matter) type. These simulation tools may also be used for determining the implantation conditions for the implantations by plasma that will be detailed below.

According to a second, favoured, example, the anisotropic implantations 700 may be performed in plasma etching equipment. In this case, it will be possible to use a capacitive coupling plasma (CCP) reactor or an inductive coupling plasma (ICP) reactor, or an immersion plasma.

The implantation of ions by plasma is an advantageous solution, in particular since it makes it possible to precisely control the implanted depth in order to:
  implant and therefore modify the entire thickness $e_{232}$ of the residual portion 202;
  implant all or part of the thickness $e_{100}$ of the layer based on GaN 100.
  Moreover, the advantage of the plasma is that there is a chemical modification in particular by H implantation, which makes the removal of the modified layer easier. Thus the selectivity of the etching is improved even more during the removal step E5.
  According to one example embodiment, this modification comprises the implantation of ions based on hydrogen (H, H$^+$, H$_2^+$, H$_3^+$, etc.).

According to another embodiment, the implanted ions are helium (He) ions or a mixture of helium and hydrogen (H/He) ions.

This ions may come for example from the following gases introduced into the reactor: H$_2$, HBr; NH$_3$.

The following parameters will be adjusted in order to obtain an anisotropic implantation 200 by plasma implantation, over a precise depth corresponding to at least the entire thickness e202 of the dielectric layer 200.

These parameters are in particular:
the pressure prevailing inside the chamber of the plasma reactor. Preferably, this pressure is below 100 millitorr, in order to avoid isotropic implantation;
the temperature will preferably be below 100° C., in order to effectively modify the dielectric layer 200.

For all these embodiments, the implantation conditions may be determined by simulation using an SRIM or TRIM tool.

The use of a plasma allows implantation at lower depths than the minimum depths that can be obtained with implanters. Thus plasma implantation makes it possible to continuously implant fine thicknesses typically of a few nanometres. This continuity of implantation from the implanted face makes it possible to improve the homogeneity of the modification according to the depth, which leads to a speed of etching of the implanted layer that is constant over time. Moreover, the increase in the selectivity conferred by the implantation vis-à-vis other layers is effective from the very start of the etching of the implanted layer. Implantation by plasma thus allows significantly improved control of the precision of etching.

In addition to the advantages mentioned above, plasma implantation makes it possible to use the same plasma reactor for:
optional deposition of the protective film 602 formed from a polymer,
anisotropic modification of the residual portion 202 is of the zone 102 of the layer based on GaN 100,
removal of the resist mask 300.
This simplifies the method, reduces the manufacturing cycles and lowers costs.

According to yet another embodiment, during the modification step E3, the plasma used is formed from a gas comprising at least one first non-carbonaceous gaseous component the dissociation of which generates said light ions and a second gaseous component comprising at least one species favouring the dissociation of the first component in order to form said light ions, wherein the gas ratio between the first component and the second component is between 1:19 and 19:1. Preferably said ratio is between 1:9 and 9:1 and preferably between 1:5 and 5:1.

Preferably:
the first component is chosen from hydrogen ($H_2$), silicon nitride ($SiH_4$), hydrogen nitride ($NH_3$) or hydrogen bromide (HBr),
the second component is chosen from helium (He), nitrogen ($N_2$), argon (Ar) or xenon (Xe).

The flow rate of the first component is preferably between 10 and 1000 sccm (cubic centimetres per minute) and the flow rate of the second component is preferably between 10 and 1000 sccm.

Advantageously, the role of the first component is to modify, by ion bombardment, the crystalline structure of the dielectric layer in order subsequently to be able to differentiate the initial dielectric layer from the modified dielectric layer. The problem is that, if we use a plasma based solely on a single component, hydrogen ($H_2$) for example, the risk is of not uniformly modifying the dielectric layer 200 in the thickness thereof. This causes poor control of the actual depth to which the modified layer has significantly improved selectivity. In this case, the depth of the ion implantation in the dielectric layer is not equivalent to the thickness of the modified dielectric layer the selectivity of which is significantly improved and which will be etched following the bombardment.

The addition of a second component acting advantageously as a dissociation gas (such as argon, helium, xenon or nitrogen) facilitates the dissociation of the first component and, thereby, assists the implantation of the first dissociated component in the dielectric layer, in the form of light ions. The implanted dose is therefore higher without needing to increase the maximum depth of implantation.

It is therefore important to find a correct ratio between the proportion of first component and second component in a plasma intended to modify the dielectric layer. Advantageously, the gas ratio between the first component and the second component is greater than 1:19 and less than 19:1.

This implantation 700 of ions is preferably formed solid plate. It makes it possible to modify the dielectric layer 200 without sputtering it. Thus this is essentially a chemical modification: the addition of ions in this dielectric layer 200 changing the selectivity in thereof. Thus the modified portions 202 of this layer 200 will be etched much more easily than the non-modified portions 204.

Selective removal of the modified portions 202.

For each of the embodiments mentioned above and based on an implantation 700 of ions, several variant embodiments for the selective removal of the modified portions 202 of the dielectric layer 200 are possible.

Dry or wet etching chemistries mentioned can be used.

According to one embodiment, the step of removal of the modified portions 202 of the dielectric layer 200 is performed by wet etching selective vis-à-vis the material based on GaN.

Preferably, the selective etching vis-à-vis the GaN is obtained by means of a solution based on hydrofluoric acid (HF) or by means of a solution based on phosphoric acid ($H_3PO_4$). In these two cases, excellent selectivity of the etching of the modified dielectric layer 200 is obtained vis-à-vis the non-modified dielectric layer 200 and vis-à-vis the layer based on GaN.

By way of example for a dielectric layer 200 of SiN, with a solution based on hydrofluoric acid (HF), the etching speed ratio between modified SiN and SiN is around 30.

By way of example also with a solution based on hydrofluoric acid (HF), the non-modified AlGaN is not etched and the modified AlGaN is not etched or is etched much more slowly than the modified SiN.

This makes it possible to entirely remove the modified portions 202 without consuming the non-modified portions 204 on the flanks 205 of the dielectric layer 200 and without consuming the layer based on GaN 100.

According to one embodiment, which is particularly advantageous when the dielectric layer 200 is made from SixNy, the selective etching of the modified portions 202 vis-à-vis the non-modified portions comprises a wet etching based on a solution comprising hydrofluoric acid (HF) diluted to x % by mass, with $x \leq 0.2$, and having a pH of less than or equal to 1.5.

Preferably, the pH is less than or equalo 1.3, preferably less than or equalo 1 and preferably strictly less than 1.

Preferably, $x \leq 0.15$ and preferably $x \leq 0.1$. According to one example, x is substantially equal to 0.1.

Preferably, the solution is obtained by adding at least one from: hydrochloric acid (HCl), sulphuric acid ($H_2SO_4$) or nitric acid ($HNO_3$).

Moreover, particularly surprisingly, this etching makes it possible to very significantly increase the selectivity of the etching of the modified dielectric layer vis-à-vis materials based on silicon oxide designated generally SiOy in the present patent application, with y integer greater than or equal to 1.

This improved selectivity is highly advantageous since it sometimes happens that a hard mask on the top of a transistor gate or an isolation trench, based on SiOy, is present during the etching step.

It follows that the hard mask or the isolation trenches are not altered by the etching of the modified portion 202. They can therefore fully fulfil their roles.

According to another embodiment, when the dielectric layer 200 is based on SixNy, the step of removal of the modified portions 202 can be performed by dry etching selective vis-à-vis the non-modified portions 204 of the dielectric layer 200 and vis-à-vis the material based on GaN. For this purpose it is possible to use a delocalised plasma (usually designated by the term "remote plasma") without bombardment.

According to one embodiment, the dry etching is performed in a plasma formed in a confined chamber using nitrogen trifluoride ($NF_3$) and ammonia ($NH_3$).

Advantageously, the dry etching comprises: an etching step consisting of the formation of solid salts; a step of sublimation of the solid species. This embodiment makes it possible to obtain very good selectivity of the etching of the modified nitride with respect to the non-modified nitride and the material based on GaN. In particular, this selectivity of the etching is greatly superior (typically a factor or at least 10) to that obtained with a solution of HF.

According to another embodiment, the step of removal of the modified portions 202 vis-à-vis the non-modified portions 204 comprises a dry etching performed by juxtaposing a gaseous mixture, preferably solely gaseous, comprising at least one first component based on hydrofluoric acid (HF). The hydrofluoric acid transforms the modified portions 202 of the dielectric layer 200 into non-volatile residues, preferably non-volatile at ambient temperature.

Advantageously, the step of removal of the portions 202 comprises, solely after the dry etching, removal of the residues that are non-volatile at ambient temperature by wet cleaning or sublimation thermal annealing.

Advantageously, the dry etching consumes the modified portions 202 of the dielectric layer 200 preferentially with respect to the non-modified portions 204 and to the layer based on GaN 100. Thus the risk of excessive consumption of the zone 102 based on GaN is reduced or even eliminated.

In the light of the above description, it is clear that the method proposed makes it possible to remove the entire dielectric layer without altering the layer based on GaN. The method proposed thus considerably improves the performances of the devices based on GaN. Moreover, this device is reliable, easily reproducible and inexpensive. Furthermore it makes it possible to relax the constraints with respect to methods that would require stopping the implantation of the dielectric layer before the layer based on GaN 100.

The invention is not limited to the embodiments described above an extends to all embodiments covered by the claims.

The invention claimed is:

1. A method for etching a dielectric layer disposed on at least one layer based on gallium nitride (GaN), the dielectric layer being formed by a material based on one from $Si_xN_y$ and $Si_xO_y$, with x and y being nonzero integers, the method comprising:

first etching of the dielectric layer on only part of a thickness of the dielectric layer in order to define, in the dielectric layer, at least one partial opening and at least one residual portion situated in line with the opening and having another thickness;

implanting ions in line with the partial opening over a thickness greater than the another thickness so as to:

modify a material of the dielectric layer in line with the partial opening over an entire thickness of the residual portion, and modify a material of the base layer of GaN over a portion of the layer based on GaN situated in line with the partial opening, the ions being taken from hydrogen (H) and/or helium (He), removing the residual portion by a second etching, the second etching being selective of the modified material of the dielectric layer with respect to nonmodified material of the dielectric layer and with respect to the modified material of the layer based on GaN; and annealing of at least the layer based on GaN for a period greater than D1 and a temperature between T1 and T2, with D1=30 s, T1=300° C., and T2=900° C.

2. The method according to claim 1, wherein the first etching is based on a fluorocarbon chemistry.

3. The method according to claim 1, wherein T2=600° C.

4. The method according to claim 1, wherein the another thickness of the residual portion is between 5 nm and 30 nm.

5. The method according to claim 1, wherein the another thickness of the residual portion is greater than 4 nm.

6. The method according to claim 1, wherein the another thickness of the residual portion is greater than 10 nm.

7. The method according to claim 1, wherein said portion of the layer based on GaN situated in line with the partial opening and the material of which is modified during the implanting has a thickness that is greater than 4 nm.

8. The method according to claim 7, wherein said thickness is between 5 nm and 30 nm.

9. The method according to claim 1, wherein the implanting is performed by means of a plasma.

10. The method according to claim 1, wherein the dielectric layer is disposed directly in contact with the layer based on GaN.

11. The method according to claim 10, wherein the layer based on GaN is made from AlGaN and surmounts a layer of GaN.

12. The method according to claim 1,
wherein the dielectric layer is made from $Si_xN_y$, and
wherein the dielectric layer is deposited at a temperature greater than or equal to 500° C.

13. The method according to claim 1,
wherein the dielectric layer is made from $Si_xO_y$, and
wherein the dielectric layer is deposited at a temperature greater than or equal to 500° C.

14. The method according to claim 1, further comprising the following steps prior to the first etching step:
depositing a layer of resist surmounting the dielectric layer; and
opening of the layer of resist in order to form a resist mask,
wherein the first etching of the dielectric layer for defining in the dielectric layer at least one partial opening is performed through the resist mask.

15. The method according to claim 14, further comprising, after the implanting and before the removing of the residual portion, removing the resist mask.

16. The method according to claim 15, wherein the removing of the resist mask is formed at least partly by a plasma based on oxygen.

17. The method according claim 14, further comprising, after the first etching of the dielectric layer and before the implanting, at least the forming of a protective film on the resist mask.

18. The method according to claim 17, wherein the protective film is formed by a conforming deposition based on a fluorocarbon chemistry, the protective film being made from $C_{x0}H_{y0}F_{z0}$, with $x_0$, $y_0$, and $z_0$ being integers.

19. The method according to claim 14, the implanting being carried out in a principal direction and by putting the dielectric layer in a presence of a plasma in which $C_{x1}H_{y1}$ is introduced, where $x_1$ is the proportion of carbon (C) and $y_1$ is the proportion of hydrogen (H), and comprising ions heavier than hydrogen, where conditions of the plasma, in particular a concentration of $C_{x1}H_{y1}$, an energy of the ions, and a principal implantation direction being chosen so that:

the plasma creates a bombardment of ions based on hydrogen coming from the $C_{x1}H_{y1}$ in the principal direction, chemical species of the plasma containing carbon coming from $C_xH_y$ form a protective carbonaceous film in particular on surfaces parallel to the direction of bombardment, and the plasma creates a bombardment of the ions heavier than hydrogen that prevent the chemical species of the plasma containing carbon and coming from the $C_{x1}H_{y1}$ from forming a carbonaceous protective film, in particular on surfaces of the resist mask that are perpendicular to the principal direction of bombardment.

20. The method according to claim 1, wherein at least two of the following steps are carried out in a same reactor:

the first etching, the implanting, and the second etching.

* * * * *